United States Patent [19]
Watanabe et al.

[11] Patent Number: 5,332,439
[45] Date of Patent: Jul. 26, 1994

[54] SCREEN PRINTING APPARATUS FOR FILLING THROUGH-HOLES IN CIRCUIT BOARD WITH PASTE

[75] Inventors: Hiroyuki Watanabe, Hadano; Tetsuji Machita, Ibaraki, both of Japan

[73] Assignee: Hitachi Techno Engineering Co., Ltd., Tokyo, Japan

[21] Appl. No.: 931,308

[22] Filed: Aug. 18, 1992

[30] Foreign Application Priority Data

Aug. 23, 1991 [JP] Japan .................. 3-211768

[51] Int. Cl.⁵ .................................. B05C 11/02
[52] U.S. Cl. .................. 118/213; 118/406; 118/504; 101/123; 271/98; 271/33
[58] Field of Search ............ 118/50, 213, 301, 406, 118/504; 427/96, 97, 282, 294; 425/89, 388, 810; 101/123, 114, 124; 271/97, 98, 33; 156/572, DIG. 31

[56] References Cited

U.S. PATENT DOCUMENTS

| | | | |
|---|---|---|---|
| 2,919,129 | 12/1959 | Sjostrom | 271/33 |
| 3,083,961 | 4/1963 | Arbter | 271/33 |
| 3,251,340 | 5/1966 | Harada | 118/213 |
| 3,765,672 | 10/1973 | Connor, Jr. | 271/33 |
| 3,924,576 | 12/1966 | Geraghty | 118/213 |
| 4,173,928 | 11/1979 | Mitter | 101/123 |
| 4,699,370 | 10/1987 | Hashimoto et al. | 271/98 |

FOREIGN PATENT DOCUMENTS

| | | |
|---|---|---|
| 56-25789 | 6/1981 | Japan . |
| 61-192632 | 8/1986 | Japan ............ 271/33 |
| 63-284893 | 11/1988 | Japan . |

Primary Examiner—W. Gary Jones
Assistant Examiner—Brenda Lamb
Attorney, Agent, or Firm—Antonelli, Terry, Stout & Kraus

[57] ABSTRACT

Disclosed is a screen printing apparatus for filling minute through-holes in a board with conductive paste or the like by screen printing. When screen printing is performed with this screen printing apparatus, the board is placed on a stage through the intermediation of a film which is supplied to the stage by means of adhesive pads. The adhesive pads are brought into contact with the uppermost one of a plurality of stacked films to catch it by adhesion and then transfer the film to a position above the stage. Films are caught one after another by adhesion.

7 Claims, 11 Drawing Sheets

SCREEN PRINTING APPARATUS FOR FILLING THROUGH-HOLES IN CIRCUIT BOARD WITH PASTE

BACKGROUND OF THE INVENTION

1. Field of the Invention

The present invention relates to a screen printing apparatus and, more specifically, to an apparatus using a screen printing method suitable for filling minute through-holes with conductive paste or the like, which holes are made, for example, in circuit boards such as unfired ceramic boards called green sheets.

2. Description of the Related Art

As is well known, a multi-layered ceramic board for high-density mounting of semiconductor parts is obtained by pressing and firing a number of accurately stacked green sheets having electronic circuit patterns on their surfaces. The stacked green sheets are electrically connected by means of conductive paste with which through-holes provided in these green sheets are filled.

A green sheet is a flexible ceramic board having a thickness of approximately 0.2 mm. It has a large number of through-holes of approximately 0.2 mm extending from one side of the sheet to the other. In forming a multi-layered ceramic board, these through-holes are filled with conductive paste. The filling operation has conventionally been conducted by screen printing.

Japanese Unexamined Patent Publication No. 63-284893 discloses a conductive paste filling method, according to which a filter consisting of a highly permeable and dustproof plastic sheet is placed on a stage (a bearer) made of a porous material. A green sheet is placed on this filter and fixed in position by suction which is maintained during the hole-filling printing process, whereby the through-holes can be reliably filled with conductive paste. That part of the conductive paste which has passed through the through-holes is absorbed by the filter, thereby preventing adhesion of the conductive paste to the porous stage. Thus, a satisfactory attraction by suction can be maintained solely by changing the filter and the trouble of cleaning the stage can be avoided.

A problem with the conductive paste filling method disclosed in Japanese Unexamined Patent Publication No. 63-284893, referred to above, is that the conductive paste adheres to the plastic sheet (the filter) each time the through-holes of one green sheet are filled with the conductive paste. Thus, it is necessary to replace the plastic sheet with a new one each time the green sheet printing process is completed for one green sheet.

If a plurality of plastic sheets are supplied to the stage when a plastic sheet is replaced, the sucking capacity of the stage is remarkably lowered, thereby making it impossible to satisfactorily fill the green-sheet through-holes with paste. Thus, only one plastic sheet (filter) should be supplied to the stage at a time.

The above-mentioned Japanese Patent Publication discloses no specific method of replacing the plastic sheet. Manually replacement is difficult and time-consuming since the plastic sheet has very low bending strength due to its porosity and thinness and consequently is easily broken.

SUMMARY OF THE INVENTION

The present invention has been made to solve the above problems. It is accordingly a first object of the present invention to provide a screen printing apparatus which is capable of automatically feeding thin filters onto the stage one after another.

A second object of the present invention is to provide a screen printing apparatus which is capable of automatically feeding plastic-sheet filters quickly onto the stage without causing any damage to them.

To achieve the above objects, there is provided, in accordance with the present invention, a screen printing apparatus comprising: a support on which a circuit board having formed therein through-holes is mounted a filter interposed therebetween; a screen mask through which, the through-holes of the circuit board are filled with paste; means for storing stacked filters; adhesion means for taking the uppermost one of the stacked filters by adhesion; means for separating the filter adhering to the adhesion means therefrom; filter attraction/-dropping means for attracting by suction the filter adhering to the adhesion means and for causing the thus attracted filter to fall by releasing the suction; and means for moving the suction/dropping means to a position above the stage.

DESCRIPTION OF THE PREFERRED EMBODIMENTS

Figure 1:
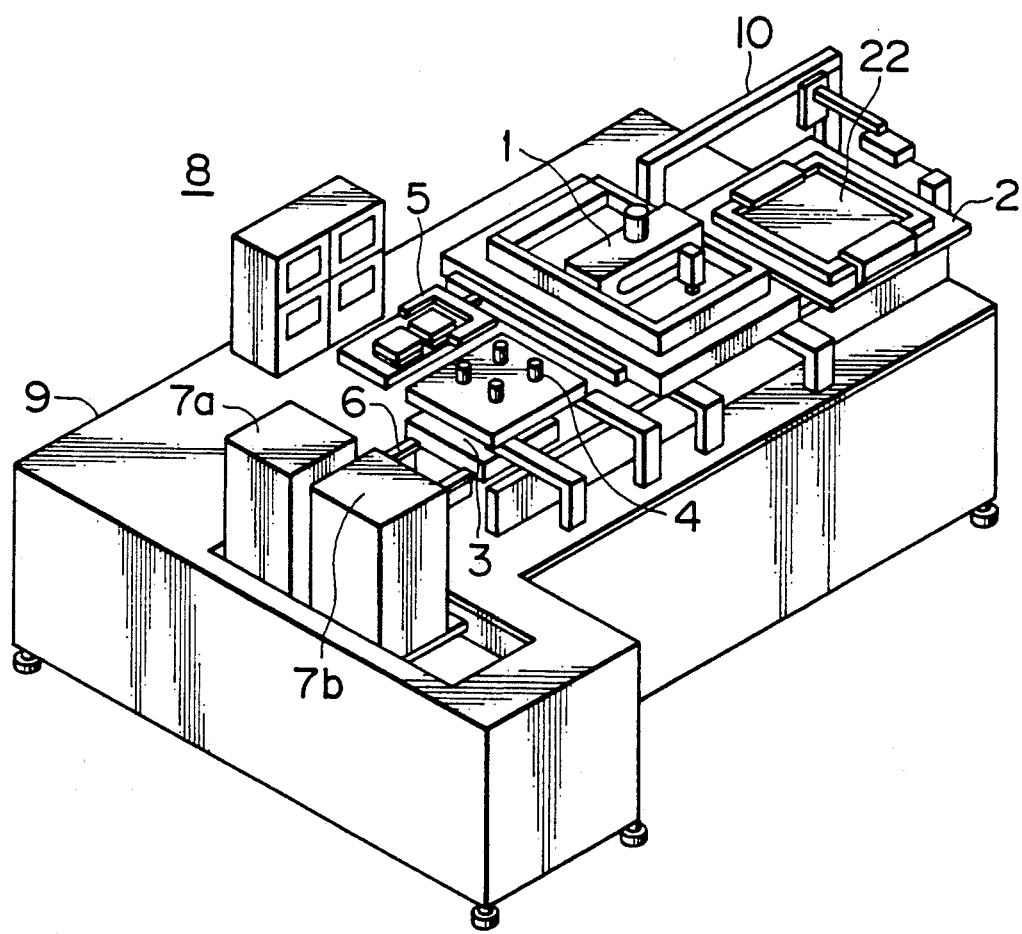
FIG. 1 is an overall perspective view of an embodiment of a conductive paste filling apparatus according to the present invention.

FIG. 1 is a overall view of a screen printing apparatus according to an embodiment of the present invention, which performs a conductive paste filling operation.

In FIG. 1, numeral 1 indicates a printing head for screen printing; numeral 2, a plate-holding/moving section which holds a screen printing plate (a screen mask) 22 and moves it to a predetermined position; numeral 3, a setting/positioning table (stage) for green sheets and plastic sheets; numeral 4, a position recognizing device for positioning; numeral 5, a sheet feeding section for feeding plastic sheets to a predetermined position; numeral 6, a green sheet supply section for supplying green sheets to a predetermined position; numerals 7a and 7b, magazines for storing green sheets; numeral 8, a sheet feeding mechanism consisting of the sheet feeding section 5, the green sheet supply section 6 and the setting/positioning table 3; numeral 9, the base of the body of the screen printing apparatus; and numeral 10, a screen paste recovery device.

The printing head 1 is arranged to apply a determined amount of conductive paste to a part of the screen printing plate and presses it according to the pattern of the plate into the through-holes of the green sheet which is the object of the filling operation. The plate-holding-/moving section 2 is arranged to set the screen printing plate at three positions: under the printing head 1, under the position recognizing device 4 and under the screen paste recovery device 10.

As will be described below, the sheet feeding mechanism 8 moves the green or plastic sheet horizontally to a position under the printing head 1. Relative positioning between the screen printing plate and the green or plastic sheet is effected by means of the setting/positioning table 3. The setting/positioning table 3 simultaneously holds a green sheet and a plastic sheet and is movable to perform fine adjustments along the X and Y-axes and in rotating directions indicated by $\theta$ (the clockwise or counterclockwise rotation of the plane on which the sheets are placed). Further, the setting/positioning table 3 moves long distances along the X-axis (or Y-axis) to feed the green or plastic sheet to a position under the printing head 1 or therefrom.

The position recognizing device 4 is arranged in the path of the horizontal movement of the setting/positioning table 3 and adjacent the printing head 1. The position recognizing device 4 has a camera, which is adapted to photograph, from above the setting/positioning table 3, a plastic or green sheet before and after printing so as to detect the position where the sheet is placed when the setting/positioning table 3 has made a horizontal movement from its position under the printing head 1 to a stop under the position recognizing device 4. The position recognizing device 4 also has four sets of illuminating devices for radiating light upwardly from under the plastic sheet, so that the position where the plastic or green sheet is placed is detected in terms of four illuminated points.

Further, provided below the position recognizing device 4 is a transmission-type illumination device (not shown) which, when the plate-holding/moving device 2 is moved horizontally and positioned, radiates light upwardly from below the screen printing plate so as to take in the image of the positioned screen printing plate.

The plastic sheet feeding section 5 has a horizontally moving handling mechanism which makes a vertical movement and a horizontal movement in a direction perpendicular to the direction of the horizontal movement of the setting/positioning table 3. By means of this horizontally moving handling mechanism, arms are inserted between the position recognizing device 4 and the setting/positioning table 3 so as to supply a plastic sheet onto the setting/positioning table 3.

The green sheet feeding section 6, which is adjacent (along the Y-axis) to the position recognizing device 4, has a horizontally moving handling mechanism which is similar to that of the plastic sheet feeding section 5 and a vertical movement mechanism. Arms are inserted between the setting/positioning table 3 and the position recognizing device 4 so as to supply a frame having a green sheet glued thereto (hereinafter referred to as a "sheet frame") and to return the sheet frame to its initial position after printing.

The sheet frames with green sheets which are to be printed are stacked in the magazine 7a and those which have already been printed are restored to the magazine 7b.

Further, though not shown in the drawing, provided on the base 9 of the printing apparatus body are an ascent/descent section for vertically moving the magazines 7a and 7b, a mechanism for horizontally moving the green sheet feeding section 6 and for positioning the same, a mechanism for drawing (or pushing) out green sheets from the magazine 7a onto the green sheet feeding section 6, and a mechanism for restoring sheet frames to the magazine 7b.

Figure 2:
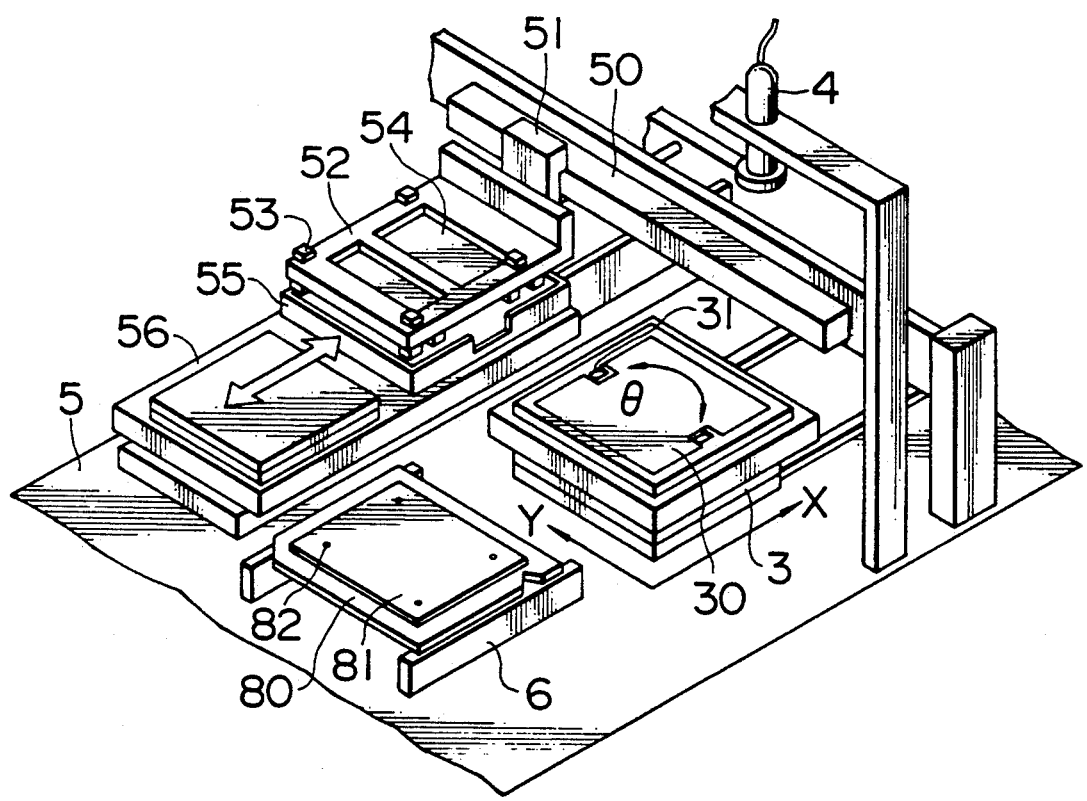
FIG. 2 is an enlarged perspective view of an essential part of a sheet feeding section.

FIG. 2 is an enlarged perspective view of the essential part of the plastic sheet feeding section 5.

In FIG. 2, the plastic sheet feeding section 5 includes, as the main section thereof, a horizontally moving handling mechanism 50 which consists of a hand raising-/lowering mechanism 51 and a hand 52 supported thereby. Four pick-ups 53 are disposed at the corners of the hand 52. Stacked plastic sheets 54 are disposed in such a manner as to contact with the pick-ups 53. The plastic sheets 54 are stored in a box 55 allowing them to be positioned in a stack state. The box 55 is placed on a slide unit plate 56 so as to be movable in the directions of the arrows.

The green sheet feeding section 6 has a sheet frame 80 to which is glued a sheet 81 having a plurality of positioning holes 82. The sheet frame 80 has a mechanism for transferring green sheets to the setting/positioning table 3, which is adjacent thereto, by means of a hand equivalent to that of the horizontally moving handling mechanism 50 of the plastic sheet feeding section 5.

The setting/positioning table 3 comprises a mechanism movable along the X and Y-axes and rotatable as indicated by $\theta$, a plurality of sheet holding sections 31 embedded in the upper surface of this mechanism, and a section plate (stage) 30 flush with the upper surfaces of the sheet holding sections 31.

Figure 3:
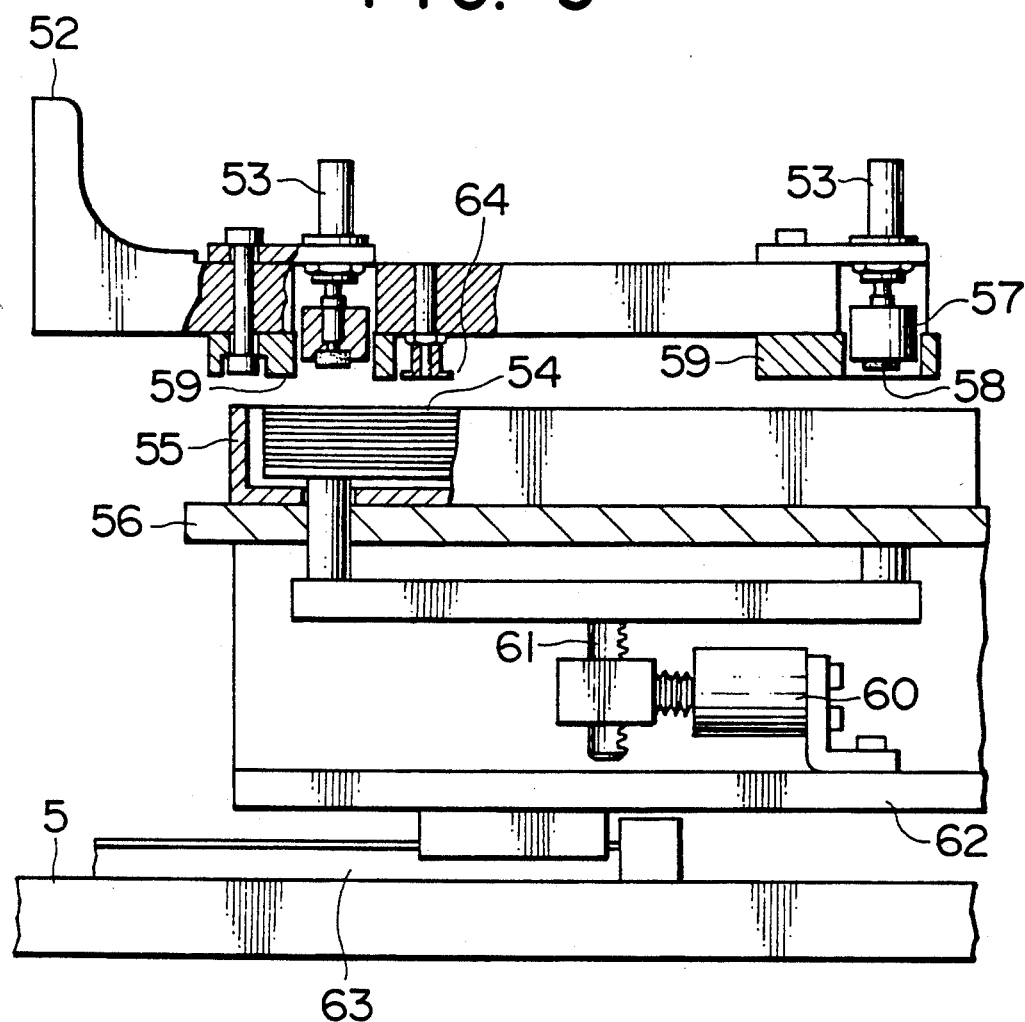
FIG. 3 is a partially sectional view of an essential part of a plastic sheet feeding section.

FIG. 3 is a partially sectional view illustrating the feeding mechanism of the plastic sheet feeding section 5.

In the drawing, the hand 52 consists of an L-shaped hand to which are secured four pick-ups 53 in such a manner as to be directed vertically toward the upper surfaces of plastic sheets fed to a position therebelow. The pick-ups 53 consist of air cylinders or the like having piston rods capable of vertical movement. Provided at the tips of the rods are cylindrical metal members 57. Integrally provided at the tips of the cylindrical metal members 57 are adhesive rubber members (adhesion means) 58 which are detachably fitted into the metal members 57. The cylindrical metal members 57 are situated in holes in plate-like separation metal members (adhesion releasing means) 59 in such a manner as to define gaps each of several millimeters with the inner walls of the holes. The lower surfaces of the adhesive rubber members 58 at the tips of the cylindrical metal members 57 are so arranged as to be several mm higher than the lower surfaces of the separation metal members 59. The adhesive rubber men%hers 58 are made of an urethane rubber or the like whose adhesive qualities can be restored by washing them in water. This embodiment employs a rubber sold under the trade name of "TACKY" (manufactured by Odaka Gomu Kogyo Kabushiki Kaisha).

A distinctive feature of these adhesive rubber members enables them to be positively attached by adhesion to almost all substances including fibers, paper, plastics, leather, wood, metals, stone and foods, simply by contact therewith.

Arranged vertically below the hand 52 is the box 55 containing plastic sheets 54. The box 55 is placed on the slide unit plate 56. Provided below the slide unit plate 56 are a motor 60 and a gear mechanism 61. By converting the rotating movement of the motor 60 into a vertical movement by the gear mechanism 61, it is possible to push the plastic sheets 54 upwardly from the bottom of the box 55 so that the upper surface of the top plastic sheet 54 is always kept in a fixed horizontal plane. Further, the slide unit plate 56 and the motor 60 are supported on a base 62 which is capable of moving horizontally (as seen in FIG. 3) on a guide rail 63 provided at the bottom thereof. Numeral 64 indicates vacuum-suction pads which are arranged adjacent the adhesive rubber members 58.

Figure 4:
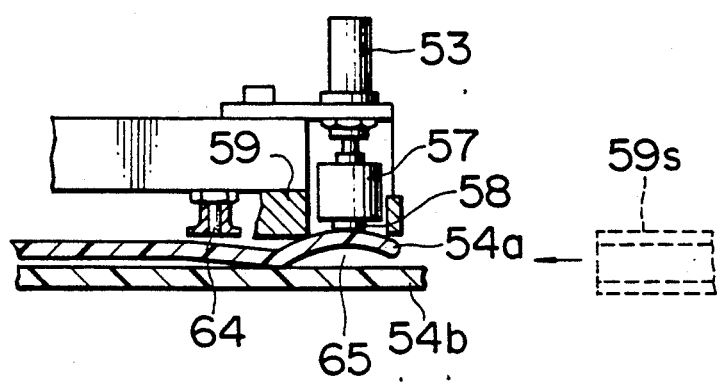
FIG. 4 is a partially sectional view for illustrating a plastic sheet supplying operation.

In the plastic sheet feeding section 5 constructed as described above, the plastic sheets 54 in the sheet box 55 are extracted and fed in the following manner: First, the pick-ups 53 are operated to lower the lower ends thereof until the adhesive rubber members 58 provided at these lower ends are pressed against the upper surface of the uppermost plastic sheet 54a and attached thereto. Next, the pick-ups 53 are raised. Then, the plastic sheet 54a ascends as the pick-ups 53 are raised. In this process, a few plastic sheets 54 accompany the uppermost one due to static electricity. However, as shown in FIG. 4, those portions of the plastic sheet 54a which are brought into contact with the separation metal members 59 are deformed in such a manner as to form gaps 65 between this plastic sheet and the next lower plastic sheet 54b. Then, air enters the gaps 65 so as to separate the plastic sheets 54a and 54b from each other, so that the lower plastic sheet 54b falls into the box 55 by its own weight. Thus, only the plastic sheet 54a attached to the adhesive metal members 58 is separated from the rest of the sheets. When the pick-ups 53 are further raised, the adhesive rubber members 58 are retracted deep into the separation metal members 59, so that further ascent of the plastic sheet 54a is blocked by the separation metal members 59, whereby the plastic sheet 54a is separated from the adhesive members 58. The plastic sheet 54a is then held by the suction pads 64 whose lower surfaces are flush with the lower surfaces of the separation metal members 59.

Further, in the condition shown in FIG. 4, in which the gaps 65 have been formed, air may be blown between the two plastic sheets 54a and 54b from nozzles 59s provided at this level as indicated by broken lines, thereby forcibly separating the two sheets from each other. When static electricity has been generated, it is preferred to moisten the air.

With the plastic sheet 54 held by the suction pads 64, the hand 52 is moved to a position above the setting/positioning table 3. The suction is then released, the plastic sheet 54 falls onto the setting/positioning table 3.

There is no damage to the plastic sheet because the stress caused in the sheet when pressed by the adhesive rubber members 58 or adhered to the suction pads 64 is of negligible value.

Figure 5:
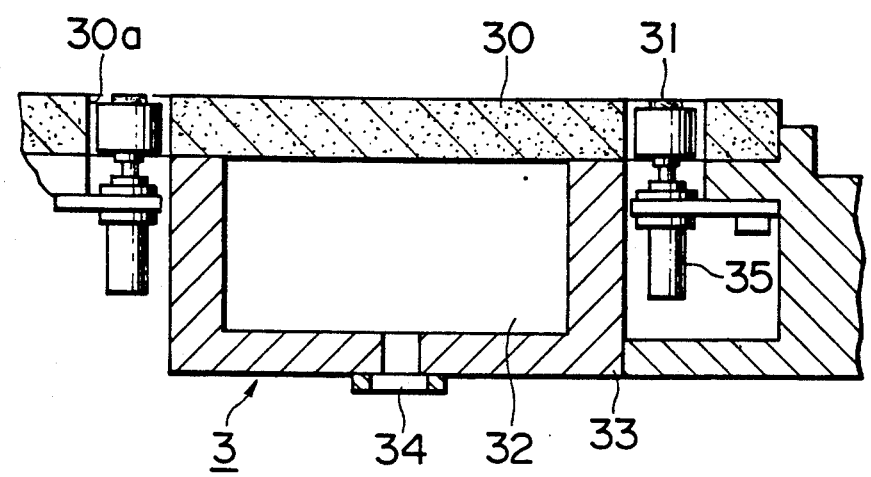
FIG. 5 is a partially sectional view showing the construction of a green sheet setting/positioning table.

FIG. 5 is a partially sectional view of the setting/positioning table 3.

In the drawing, the suction plate 30, which is attached to the top surface of the setting/positioning table 3, is made of a porous ceramic plate or a porous metal plate. Provided under the suction plate 30 is a cavity member 33 having a U-shaped cross section so as to define therein an air pocket 32 in the central portion thereof. Further, an air suction port 34 is provided at the center of the cavity member 33. Further, provided at positions corresponding to the four corners of the suction plate 30 are sheet holding members 31 each having a construction similar to that of the plastic sheet pick-up mechanism shown in FIG. 3. The upper tips of the sheet holding members 31 are adhesive and are arranged flush with the upper surface of the suction plate 30. During screen printing, a vacuum is created by sucking air through the air suction hole 34, so that the plastic sheet 54 continues to be held by suction. Further, the green sheet thereon also continues to be held due to the permeability of the plastic sheet 54.

Figure 6:
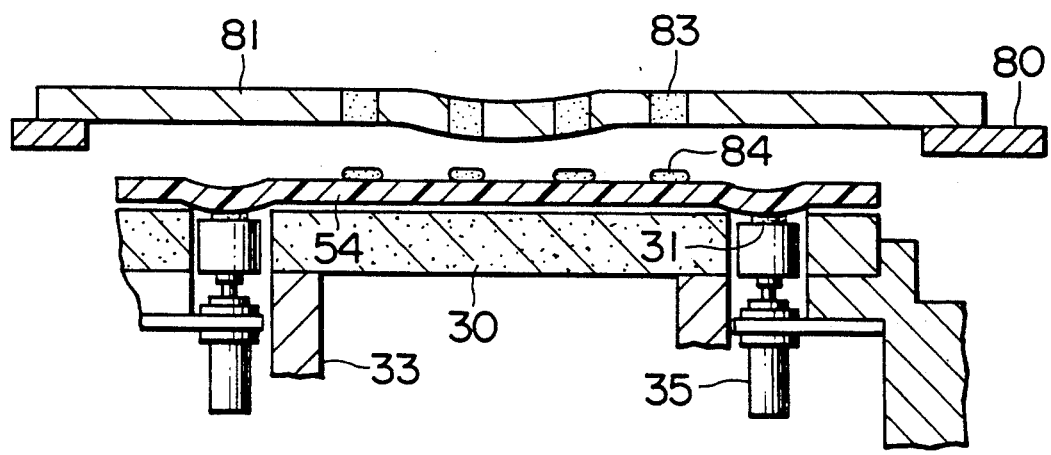
FIG. 6 is a partially sectional view for illustrating the operation of positioning the setting/positioning table, plastic sheet and green sheet.

The operation of releasing the plastic sheet 54 on the setting/positioning table 3 will be described with reference to FIG. 6. In the condition shown in FIG. 6, a filling of conductive paste has been finished and the sheet frame 80 raised. Due to the adhesiveness of the conductive paste on the upper surface of the plastic sheet 54, the green sheet 81 on the sheet frame 80 is raised with the plastic sheet 54 adhering thereon and with both sheets deformed in the process. However, due to the suction force by the suction plate 30 and the adhesiveness of the rubber members 31 provided in the holes 30a in the suction plate 30, the plastic sheet 54 is attracted by suction to the side of the suction plate 30 and separated from the green sheet 81 and then fastened to the upper surface of the suction plate 30.

When removing the plastic sheet 54, the pick-ups 35 are operated to lower the adhesive rubber members 31 so as to deform the corner portions of the plastic sheet 54 as shown in the drawing, thereby separating the plastic sheet 54 and the adhesive rubber member 31 from each other. Then, the suction of the suction plate 30 is stopped. This causes the force retaining the plastic sheet 54 to be canceled, allowing the plastic sheet to be freely removed. It is expedient to cancel the suction of the suction plate 30 prior to raising the green sheet 81 and to separate the plastic plate 54 and the adhesive rubber members 31 from each other after raising the green sheet 81 since this facilitates raising of the green sheet 81 due to the absence of suction force.

Due to the above arrangement, it is possible to reliably separate the thin and light plastic sheet 54 which has been raised together with the green sheet 81 adhered to its back surface.

Numeral 83 indicates the conductive paste with which the through-holes in the green sheet 81 are filled, and numeral 84 indicates the portion of conductive paste remaining on the upper surface of the plastic sheet 54.

Figure 7:
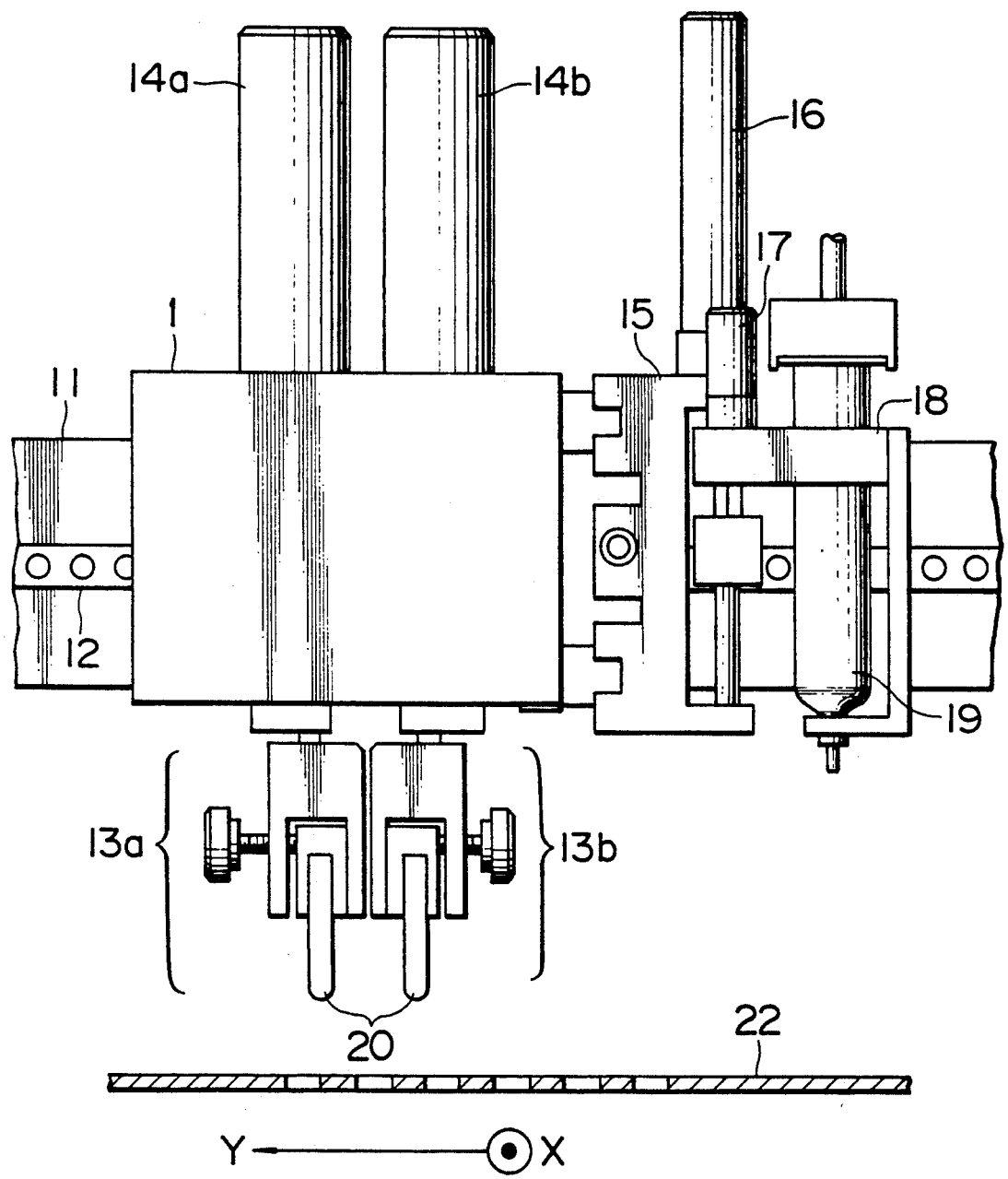
FIG. 7 is a side view showing the construction of a printing head.

FIG. 7 shows the construction of the principal section of the printing mechanism of the printing head 1.

In the drawing, the printing head 1 is mounted on a printing frame 11 in such a manner as to be movable in a horizontal plane along the Y (or X) axis on a guide 12 formed on the printing frame 11. Squeegee units 13a and 13b are secured to the lower part of the printing head 1. The squeegee units 13a and 13b are vertically movable by vertical drive sources 14a and 14b. The entire printing head 1 is moved along the Y-axis with the squeegee units 13a and 13b lowered to the screen printing plate 22 of the plate-holding/moving section 2, and, in this condition, conductive paste discharged onto the upper surface of the screen printing plate 22 is pressed into the plate by spatulas 20.

Figure 10:
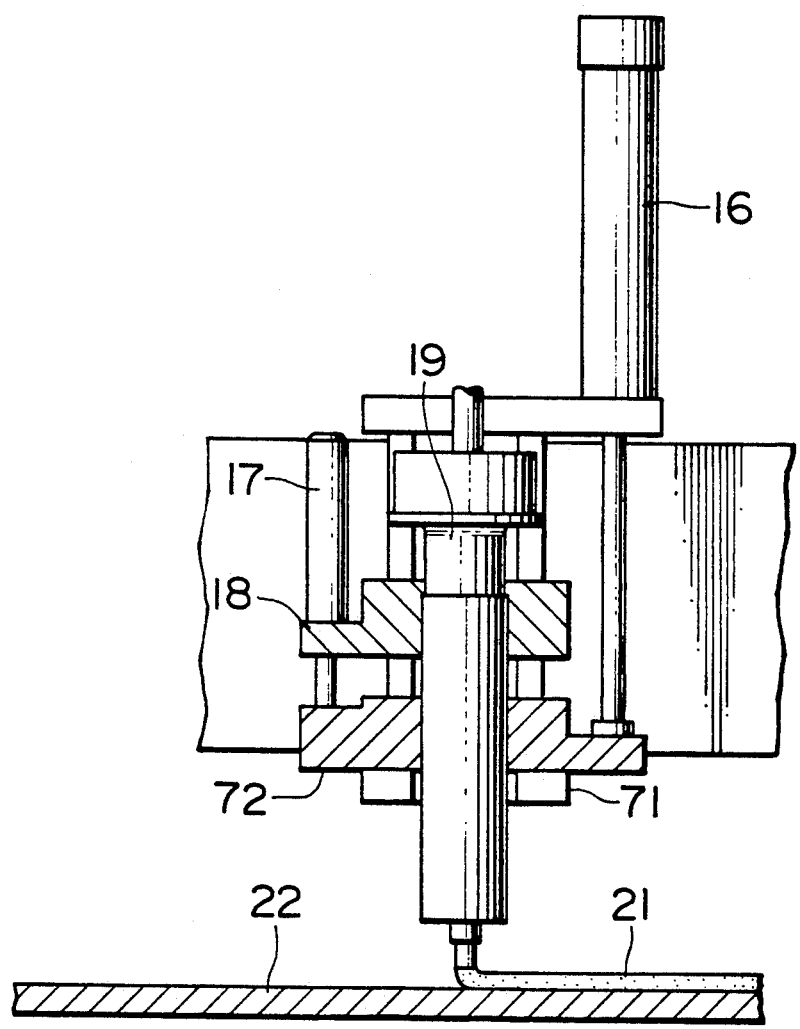
FIG. 10 is a front view illustrating the operation of a paste supply mechanism.

The printing head 1 has a driving mechanism 15 for moving it along the X (or Y) axis perpendicular to the horizontal movement on the guide 12. Connected to the driving mechanism 15 is a two-step vertical positioning mechanism which consists of two air cylinders 16 and 17 having different strokes. An injector-like paste feeding nozzle 19 is attached to the air cylinder 17 having a smaller stroke by way of a holding metal member 18, and the discharge tip of the nozzle 19 is positioned a predetermined distance above the plane where the screen printing plate 22 is placed. In this position, conductive paste is discharged onto the plate. The positioning of the paste feeding nozzle is effected in the following manner: First, it is roughly positioned by means of the air cylinder 16 which has a larger stroke. Then it is finely positioned by means of the air cylinder 17 having the smaller stroke. In this way, the paste feeding nozzle 19 is quickly set in a predetermined position. By adjusting the space between the tip of the paste feeding nozzle 19 and the upper surface of the screen printing plate to an appropriate constant gap, the conductive paste 21 is discharged onto the upper surface of the screen printing plate 22 at a constant rate, as shown in FIG. 10. The plate-holding/moving section 2 is positioned below the printing head 1.

In discharging the conductive paste, the nozzle 19 is first positioned such that the discharge tip thereof is spaced apart by a fixed distance from the surface of the screen printing plate. Then, the conductive paste is discharged while stirring the paste in the nozzle 19, with the nozzle being moved horizontally. When the nozzle has reached an edge of the screen printing plate, the horizontal movement is stopped and, at the same time, the operation of discharging conductive paste is stopped. Then, by operating the air cylinder 17 so as to contract the same, the tip of the nozzle 19 is pressed against the screen printing plate, thereby causing the discharged paste to adhere to the screen printing plate more firmly. Then, the entire nozzle 19 is raised to cut the discharged paste off the nozzle. After that, the nozzle 19 is moved to the next filling position where the same discharge operation is repeated.

Figure 8:
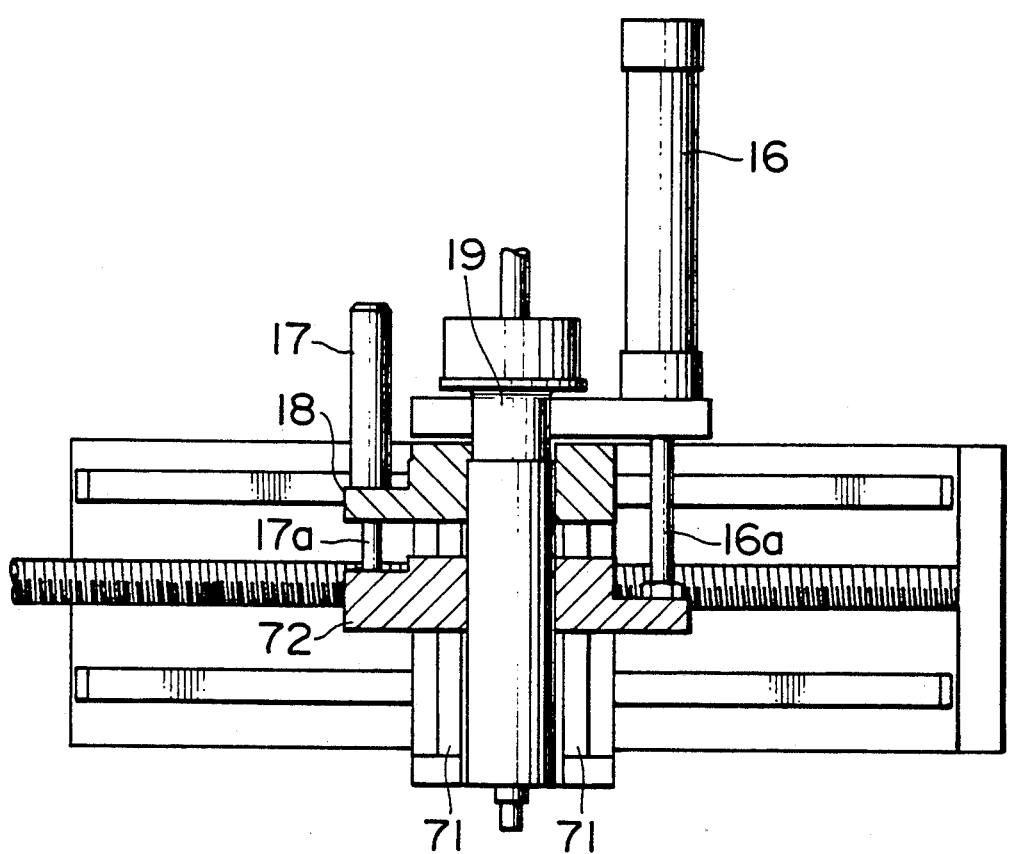
FIG. 8 is a front view showing the construction of the printing head.

FIG. 8 is a front view of the printing head 1. A rod 16a of the air cylinder 16 is connected to a block 72 joined to vertical guide sections 71. Connected to the block 72 is a rod 17a of the cylinder 17 which is fastened to the holding metal member 18 for holding the injector-like paste feeding nozzle 19 in position.

Figure 9:
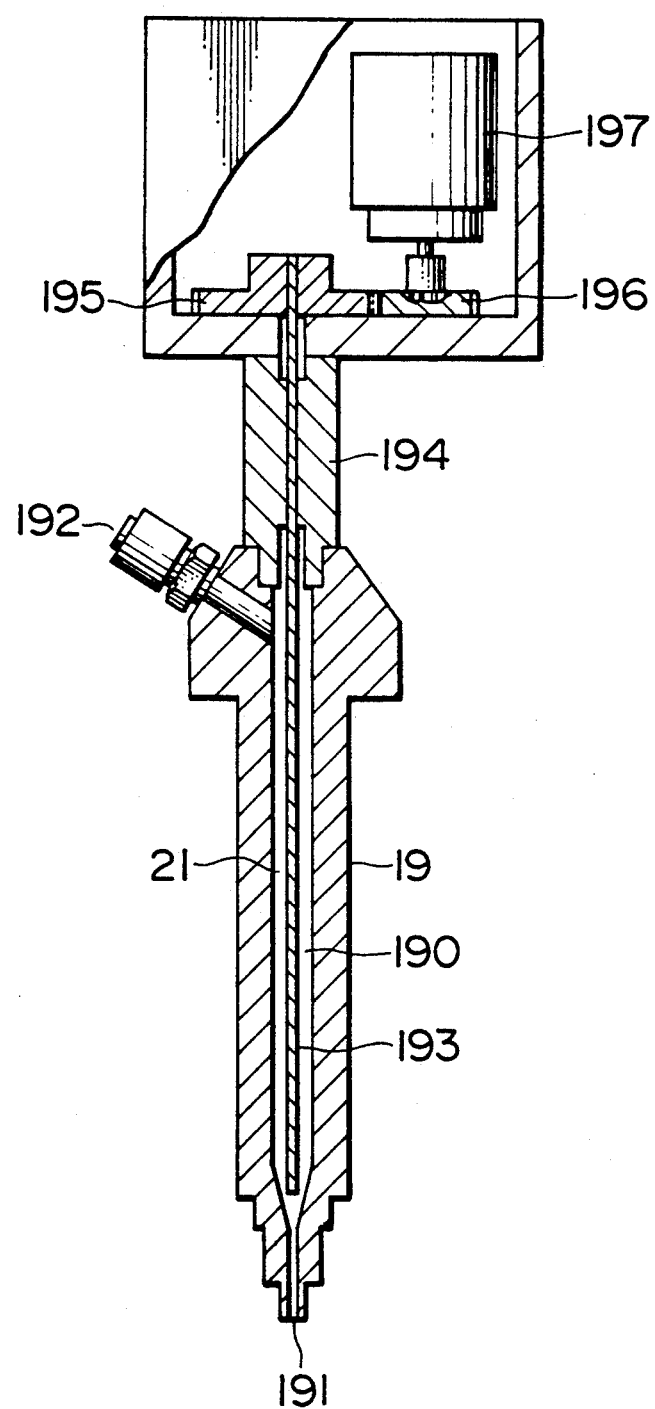
FIG. 9 is a partially sectional view of a paste supply nozzle.

FIG. 9 is a partially sectional view of the injector-like paste feeding nozzle 19, which has a paste storing chamber 190 formed in the central portion of a cylindrical body of the nozzle. A discharge port 191 is provided at the tip of the paste feeding nozzle and is connected to an air source (not shown) through an air supply port 192 provided in the side surface of the upper section of the nozzle. Extending into the paste storing chamber 190 is a stirring shaft 193 having a diameter smaller than the bore diameter of the nozzle. The upper section of the stirring shaft 193 is connected to a gear 195 by way of a shaft holding member 194. A rotating shaft of a motor 197 is connected to a gear 196 which is in mesh with the gear 195, so that the rotation of the motor 197 causes the shaft 193 to rotate, thereby constantly stirring the conductive paste 21 in the paste storing chamber 190 so as to prevent the conductive paste 21 from drying and the metal powder component of the paste from being separated from the additive component thereof. The conductive paste 21 being stirred is discharged through the discharge port 191 by air introduced from the air supply port 192.

Figure 11:
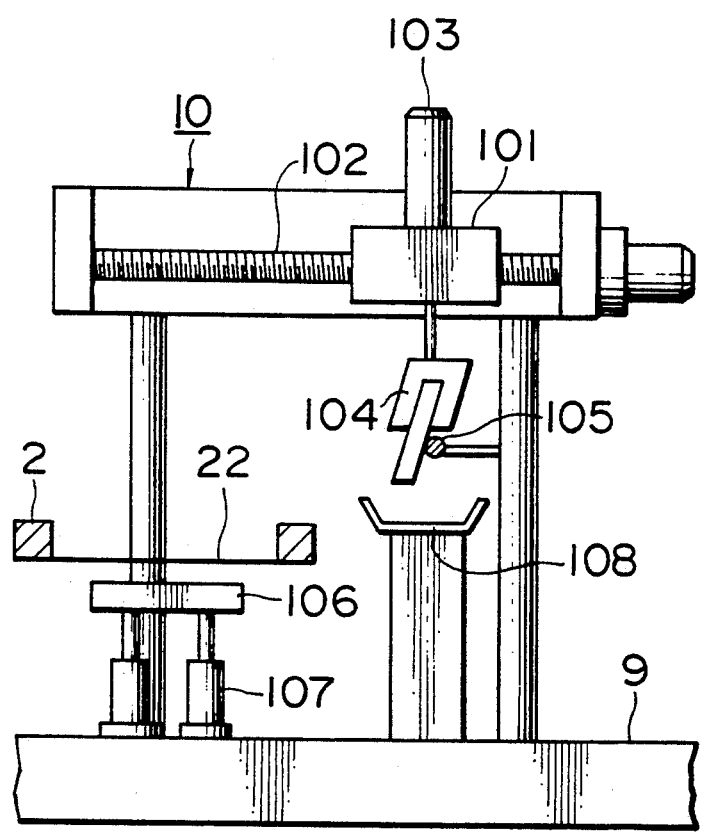
FIG. 11 is a front view of a paste recovery mechanism.

FIG. 11 is a side view of a screen paste recovery device 10 which has a recovery head 101 provided above the plate-holding/moving device 2. The recovery head 101 is connected to a horizontal movement mechanism 102 so as to be laterally movable (as seen in the drawing). Further, integrally provided on the recovery head 101 is a vertical driving mechanism 103 adapted to vertically move an upright squeegee unit 104 provided below. By means of the vertical driving mechanism 103, the squeegee unit 104 is brought into close contact with the upper surface of the screen printing plate placed on the plate-holding/moving section 2. Further, by horizontally moving the squeegee unit 104 on the upper surface of the plate by means of the horizontal movement mechanism 102, the conductive paste remaining on the surface of the screen printing plate is wiped off so as to be recovered. With the squeegee unit 104 being held in contact with a wire 105 disposed to extend in the proximity of the plate-holding/moving section 2, the vertical movement mechanism 103 is driven to vertically move the squeegee unit 104 so as to cause it to be rubbed by the wire 105, thereby causing the conductive paste on the squeegee unit to adhere to the wire 105 and then fall onto a receptacle 108 by its own weight.

Numeral 106 indicates a plate for supporting the bottom surface of the plate-holding/moving section 2 when conductive paste is recovered. The plate 106 is movable vertically with respect to the bottom surface of the plate-holding/moving section 2 by means of a driving section 107. When recovering conductive paste, the plate 106 is held in close contact with the bottom surface of the plate-holding/moving section 2 and supports the screen printing plate 22 from below.

Figure 12:
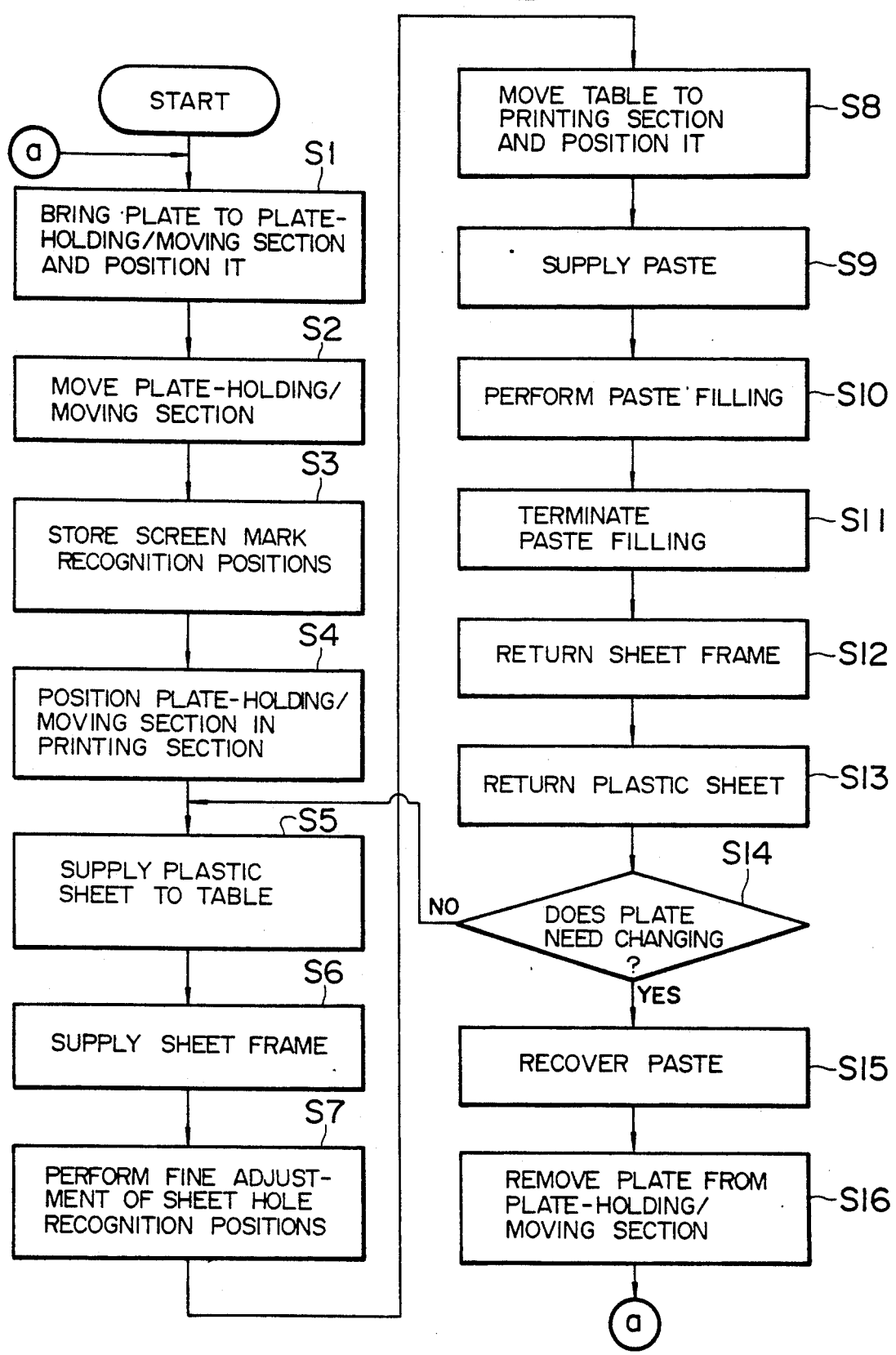
FIG. 12 is a flowchart illustrating the operation of the conductive paste printing (filling) apparatus.
Figure 13:
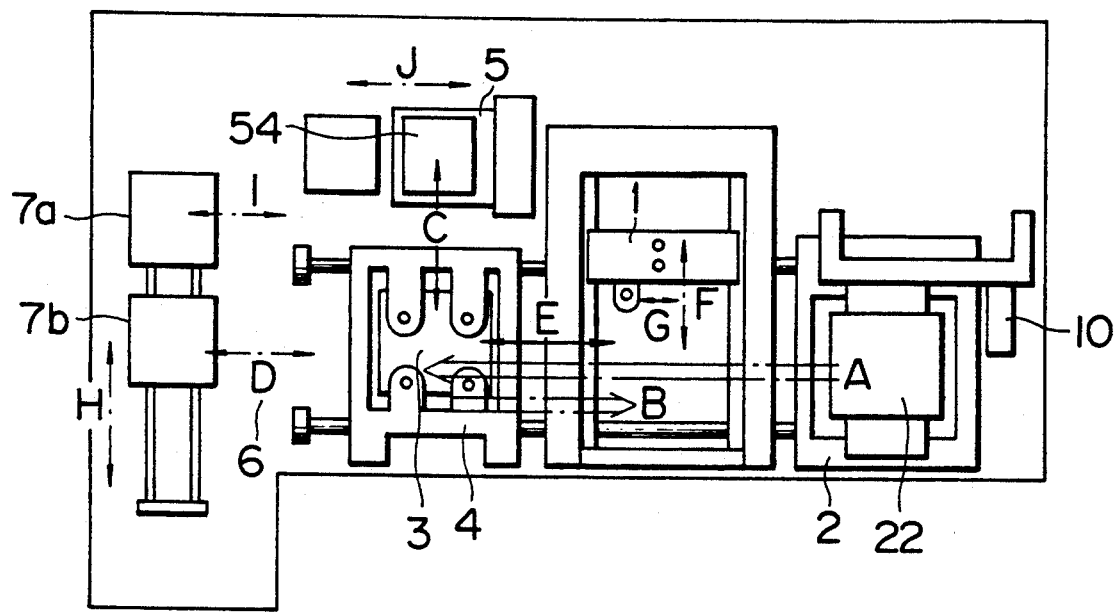
FIG. 13 is a plan view for illustrating the operation of supplying screen printing plates, green sheets and plastic sheets.

FIG. 12 is a flowchart for illustrating the operation of the screen printing apparatus in its entirety. FIG. 13 is a schematic plan view of the apparatus for illustrating the operations of feeding screen printing plates and plastic and green sheets. Hereinunder, the operation of the apparatus as a whole will be described with reference to FIGS. 12 and 13. Here, the magazines 7a and 7b storing a plurality of sheet frames will be regarded as one lot, and the conductive paste filling operation is conducted on a magazine basis.

Step S1: A screen printing plate 22 corresponding to the type (specifications) of the green sheet used is set at a predetermined position on the plate-holding/moving section 2 and retained thereat.

Step S2: The plate-holding/moving section 2 is moved toward the position recognizing device 4, as indicated by the arrow A of FIG. 13, and is set at a predetermined position to be recognized;

Step S3: The positioning marks provided in the four corners of the screen printing plate 22 are detected by the camera of the position recognizing device 4, and the positions are stored.

Step S4: The plate-holding/moving section 2 is moved to the printing section of the printing head 1, and the screen printing plate 22 is set at a printing position.

Step S5: Some of the plastic sheets 54 placed in the sheet box 55 are picked up by the pick-up 53 shown in FIG. 3. One plastic sheet is separated from the rest and moved toward the setting/positioning table 3, as indicated by the arrow C. Then, it is placed on the upper surface of the suction plate 30 of the setting/positioning table 3 shown in FIG. 6.

Step S6: A sheet frame 80 to which a green sheet 81 is glued is extracted from the magazine 7b by the sheet feeding section 6, and is positioned on the plastic sheet 54 on the setting/positioning table 3 after moving as indicated by the arrow W (see FIG. 6).

Step S7: The plastic sheet 54 and the sheet frame 80 are attracted by suction from the air suction hole 34 below the setting/positioning table 3 and secured in position on the suction plate 30. The position recognition holes of the green sheet 81 are recognized and the entire sheet from 80 is moved for positioning such that the position recognition holes of the green sheet 81 coincide with the previously stored positioning marks of the screen printing plate 22.

Step S8: The setting/positioning table 3 is moved to the printing section of the printing head 1, as indicated by the arrow E, and positioned thereat.

Step S9: The printing head is moved horizontally, as indicated by the arrow F, and the paste feeding nozzle 19 filled with paste is lowered and further moved horizontally, as indicated by the arrow G, thereby feeding conduction paste onto the surface of the screen printing plate (see FIG. 10).

Figure 14:
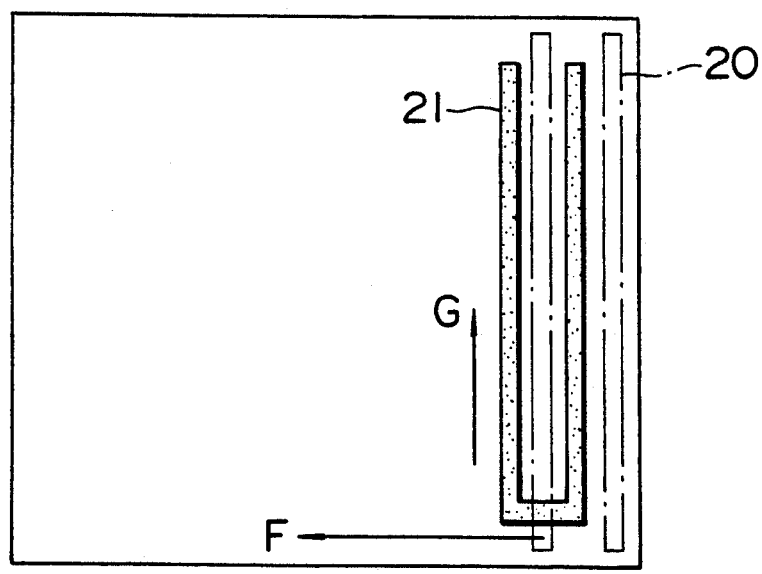
FIG. 14 is a plan view for illustrating the operations of discharging conductive paste and pressing the same.

Step S10: By moving the squeegee units 13a and 13b in the direction of the arrow F on the top surface of the screen printing plate, the conductive paste on the printing plate is moved while being pressurized, thereby filling the large number of through-holes of the green sheets 81 glued to the sheet frame 80 with conductive paste (see FIGS. 6 and 14). Since the plastic sheet 54 and the green sheet 81 are attracted by suction to the suction plate 30, the paste is also attracted by suction, thereby reliably filling the through-holes with the paste.

Step S11: The sheet frame 80 with the green sheet 81 completely filled with conductive paste and the setting/positioning table 3 are moved in the direction to the arrow E so as to be returned to the position of the recognition camera of the position recognizing device 4.

Step S12: The sheet frame 80 is returned to the magazine 7a through handling in the directions of the arrows H and I.

Step S13: The plastic sheet 54 on the setting/positioning table 3 is returned to the initial position of the plastic sheet feeding section 5 through handling in the direction of the arrow C, and then in the direction of the arrow J, so as to be recovered.

Step S14: A Judgment is made as to whether it is necessary to change the screen printing plate.

Step S15: When it is necessary the screen printing plate is moved together with the plate holder from the printing section and restored to the initial position. Then, the conductive paste recovery operation is conducted, as shown in FIG. 11.

Step S16: The screen printing plate is detached from the plate holder. Then, a similar process is repeated with respect to the green sheet to be printed next. That is, when the screen printing plate is detached, the process is executed from the feeding of the plastic sheet 54 onward, and, when the same screen printing plate continues to be used, the process is executed from the setting of the sheet frame to be printed.

While the present invention has been concretely described with reference to the above embodiment, this should not be construed restrictively. Various modifications are naturally possible without departing from the scope of the present invention.

For example, the following modifications can be made:

1. In the case where low dustproofness is not required for the board, it is possible to use paper or cloth as the filter material.

2. The feeding of the board onto the stage can be conducted by using pads adapted to attract the board by suction.

3. The screen printing apparatus may have a general construction such that a sheet (filter) feeding section, a green sheet (board) supply section, a positioning section, a screen printing section, a green sheet (board) recovery section, a filter recovery section, etc. are successively arranged on a turn table, and the operations corresponding to those of steps S1 through S6 of FIG. 12 may be successively executed while intermittently turning the turn table.

As has been described above, with the screen printing apparatus of the present invention, stacked films made of a porous or highly permeable material are supplied onto the stage by means of adhesive pads, so that if friction is caused for some reason and the films tend to adhere to each other due to inter-film static electricity thereby generated, the films can be reliably separated one from each other before they are supplied.

Further, since unnecessary stress is not applied to the films, the films can be quickly supplied without being damaged even in the case of films which can be easily broken, such as easily broken plastic sheets.

What is claimed is:

1. A screen printing apparatus comprising: a support on which a circuit board having through-holes formed therein is placed with a filter interposed there between; a screen mask through which the through-holes in the circuit board are filled with paste; means for storing filters together in stacked relationship; adhesion means for taking the uppermost one of the stacked filters by adhesion; means for separating the filter adhering to said adhesion means therefrom; filter attraction/dropping means for attracting by suction the filter adhering to the adhesion means and for causing the thus attracted filter to fall by releasing the suction; and means for moving said attraction/dropping means to a position above said support.

2. A screen printing apparatus according to claim 1, wherein said adhesion means is detachably mounted on a head for fixing said adhesion means in position.

3. A screen printing apparatus according to claim 1, wherein said adhesion means is provided in said separating means so as to be vertically movable therein.

4. A screen printing apparatus according to claim 1, wherein said filter attraction/dropping means is arranged adjacent said separating means.

5. A screen printing apparatus according to claim 1, further including means for blowing air, said air blowing means being disposed adjacent said separating means for separating filters from said adhesion means.

6. A screen printing apparatus according to claim 1, wherein said support is provided with means for attracting by suction the filter and the circuit board which are successively placed thereon, and filter adhesion means for attracting the filter by adhesion.

7. A screen printing apparatus according to claim 6, wherein said filter adhesion means provided on said support is movable vertically in holes formed in said support.

* * * * *